(12) United States Patent
Glinsner et al.

(10) Patent No.: US 10,707,059 B2
(45) Date of Patent: Jul. 7, 2020

(54) METHOD AND DEVICE FOR PLASMA TREATMENT OF SUBSTRATES

(71) Applicant: EV Group E. Thallner GmbH, St. Florian am Inn (AT)

(72) Inventors: Thomas Glinsner, St. Florian am Inn (AT); Christoph Flotgen, St. Florian am Inn (AT); Johann Bernauer, St. Florian am Inn (AT); Thomas Wagenleitner, Aurolzmunster (AT); Thomas Wieser, Kirchdorf am Inn (DE); Florian Schmid, Ried im Innkreis (AT); Thomas Plach, Stadl-Paura (AT); Roman Anzengruber, Riedau (AT); Alexander Nones, Obernberg am Inn (AT); Uwe Kriebisch, St. Florian am Inn (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 423 days.

(21) Appl. No.: 15/306,132

(22) PCT Filed: May 9, 2014

(86) PCT No.: PCT/EP2014/059524
§ 371 (c)(1),
(2) Date: Oct. 24, 2016

(87) PCT Pub. No.: WO2015/169385
PCT Pub. Date: Nov. 12, 2015

(65) Prior Publication Data
US 2017/0047203 A1   Feb. 16, 2017

(51) Int. Cl.
*H01L 21/00*   (2006.01)
*H01J 37/32*   (2006.01)
(Continued)

(52) U.S. Cl.
CPC .. *H01J 37/32568* (2013.01); *H01J 37/32091* (2013.01); *H01J 37/32532* (2013.01);
(Continued)

(58) Field of Classification Search
None
See application file for complete search history.

(56) References Cited

U.S. PATENT DOCUMENTS

| | | | | |
|---|---|---|---|---|
| 4,885,074 A | * | 12/1989 | Susko | H01J 37/32082 204/298.35 |
| 5,733,511 A | * | 3/1998 | De Francesco | H01J 37/32174 422/186.05 |

(Continued)

FOREIGN PATENT DOCUMENTS

| | | | |
|---|---|---|---|
| EP | 0 473 930 | 3/1992 | ............. H01L 21/68 |
| JP | 60-012734 | 1/1985 | ........... H01L 21/302 |

(Continued)

OTHER PUBLICATIONS

Koike Atsuyoshi, Plasma Processing Device, Jan. 23, 1985, Hitachi Ltd., pp. 1-2. (Year: 1985).*

(Continued)

*Primary Examiner* — Sylvia MacArthur
*Assistant Examiner* — Michelle Crowell
(74) *Attorney, Agent, or Firm* — Kusner & Jaffe (57) ABSTRACT

A device for bombarding at least one substrate with a plasma with a first electrode and a second electrode that can be arranged opposite thereto, which electrodes are formed together producing the plasma between the electrodes wherein at least one of the electrodes is formed from at least two electrode units. In addition, this invention relates to a corresponding method.

4 Claims, 4 Drawing Sheets

(51) Int. Cl.
*H01L 21/687* (2006.01)
*H01L 21/3065* (2006.01)
*H01L 21/67* (2006.01)

(52) U.S. Cl.
CPC .. *H01J 37/32715* (2013.01); *H01J 37/32733* (2013.01); *H01L 21/3065* (2013.01); *H01L 21/67069* (2013.01); *H01L 21/68785* (2013.01)

(56) References Cited

U.S. PATENT DOCUMENTS

| | | | | |
|---|---|---|---|---|
| 5,990,016 | A * | 11/1999 | Kim | H01L 21/67069 156/345.34 |
| 2002/0159216 | A1 | 10/2002 | Ennis | 361/234 |
| 2006/0278339 | A1 * | 12/2006 | Kim | H01J 37/32091 156/345.47 |
| 2008/0135177 | A1 * | 6/2008 | Kim | C23C 16/4407 156/345.43 |
| 2008/0202689 | A1 * | 8/2008 | Kim | H01J 37/32477 156/345.43 |
| 2008/0277064 | A1 * | 11/2008 | Kim | H01J 37/32091 156/345.38 |
| 2009/0250443 | A1 | 10/2009 | Kim | 219/121.36 |
| 2012/0003836 | A1 | 1/2012 | Kellogg et al. | 438/710 |
| 2012/0164834 | A1 | 6/2012 | Jennings et al. | |
| 2015/0262794 | A1 * | 9/2015 | Kihara | H01J 37/32091 216/71 |
| 2016/0329235 | A1 * | 11/2016 | Fehkuhrer | H01L 21/67092 |

FOREIGN PATENT DOCUMENTS

| | | | | |
|---|---|---|---|---|
| JP | S60-12734 | A | 1/1985 | |
| JP | 62130277 | A * | 6/1987 | |
| JP | 63188943 | A * | 8/1988 | |
| JP | 01108382 | A * | 4/1989 | C23C 16/5096 |
| JP | 04-317325 | | 11/1992 | H01L 21/302 |
| JP | 10289881 | A * | 10/1998 | |
| JP | 2000012472 | A * | 1/2000 | |
| JP | 2002-009043 | | 1/2002 | H01L 21/3065 |
| JP | 2007184476 | A | 7/2007 | |
| JP | 2014505362 | A | 2/2014 | |
| KR | 10-2008-0053167 | A | 6/2008 | |
| WO | WO 03/038891 | | 5/2003 | H01L 21/68 |

OTHER PUBLICATIONS

International Search Report from corresponding International Patent Application No. PCT/EP2014/059524, dated Jan. 19, 2015.

* cited by examiner

METHOD AND DEVICE FOR PLASMA TREATMENT OF SUBSTRATES

FIELD OF THE INVENTION

The present invention relates to a device for bombarding a substrate with a plasma as well as a corresponding method for bombarding a substrate with a plasma.

BACKGROUND OF THE INVENTION

Many semiconductor production processes contain one or more plasma treatment steps. The plasma can be used, e.g., for coating a substrate, for depositing semiconductor layers, for etching a substrate, for plasma activation, or for creating an ion reservoir. In this case, gases such as, e.g., silane ($SiH_4$), helium (He), argon (Ar), hydrogen ($H_2$) and/or nitrogen trifluoride ($NF_3$) are directed into the plasma chamber. $SiH_4$ or $H_2$ are used, e.g., in the deposition of semiconductor lavers, and $NF_3$ is used in the plasma etching of semiconductor layers. If a mixture made of noble gas and a reactive gas is used, the layer composition can be controlled by the adjustment of the gas mixture ratios. Thus, not only metals, but also oxides, nitrides and carbides can be deposited. Working gas and/or selection of gas mixture, gas flow and pressure has/have an influence on the plasma that is produced. Atmospheric-pressure plasma, low-pressure plasma or high-pressure plasma are practical examples. In contrast to low-pressure plasma or high-pressure plasma, atmospheric-pressure plasmas do not require any reaction vessel, which ensures the maintenance of a pressure level that is other than atmospheric pressure or deviating gas atmospheres. Plasma chambers can be operated in a pulsed manner or continuously, for example with plasma processes based on high-frequency discharge, microwave discharge, d.c. discharge, as well as d.c. magnetron sputtering and/or high-frequency magnetron sputtering, For the production of plasmas, there are very different methods that differ considerably with respect to the type of energy coupling. A d.c. discharge can be produced by application of a d.c. voltage. Capacitively-coupled MHz discharges (CCP: capacitively-coupled plasma) are used for plasma etching and plasma coating. Conductive and also insulating substrates can be treated with CCP plasmas. Ion flows and plasma density can be controlled separately from one another by the use of several frequencies. In the case of an inductively-coupled discharge (ICP: inductively-coupled plasma), the plasma density is still further increased, since the plasma acts as a secondary winding of a transformer. The coupling is done via a dielectric electrode, which has the disadvantage that a metal coating of this electrode can further impede the coupling.

The substrate is fastened to a holding device in the reaction chamber, preferably a plasma chamber. In this case, a high-frequency voltage is applied to the holding device of the (semiconductor) substrate in order to direct the reactive ions from the plasma to the surface to be treated. The high-frequency voltage is applied to the substrate itself by means of the holding device.

Mechanical clamping devices such as, for example, 3-point mountings, are used, hut cause sagging substrates, abrasion, and poor heat contact. The substrate is raised using pins located in the sample holder so that a robotic gripper (paddle), designed in particular as a robotic arm, can run below or laterally to the wafer and will remove the latter with a forward movement of the pins. A disadvantage is that thin wafers bend greatly, and thus an inaccurate positioning of the substrate on the pins also results. The electrostatic holding is a good alternative. The substrate can be secured by an electrical voltage between the sample-holder electrodes. Electrostatic wafer-holding devices are part of the plasma chamber and are used as lower electrodes to generate plasma. In this case, the electrode is electrically insulated by the chamber wall. In embodiments where an inner round electrode and several outer ring electrodes are used, the individual ring electrodes are mutually insulated from one another. Electrostatic wafer-holding devices are shown in, for example, US 2002/0159216 A1 as well as EP 0473930 A1.

Wafer-holding devices have to pick up and put down a wafer on the holding device or lift away a wafer that has been put down from the holding device in the holding device of a lifting mechanism with loading pins, A lifting mechanism is integrated in a part of the second electrode in WO 03/038891 A1 or is integrated in the substrate holder in US 2012/0003836 A1 and can be operated by means of a control network.

Structures with loading pins as sample pickup devices have the following problem: because of the loading pin, there is inhomogeneity of the plasma field, which leads to voltage peaks during the process at the necessary recesses.

SUMMARY OF THE INVENTION

The object of this invention is therefore to provide a method and a device that ensure the generation of homogeneous plasma with a uniform profile, in particular over the entire substrate surface.

This object is achieved with the features of the independent claim(s). Advantageous further developments of the invention are indicated in the subelaims. All combinations of at least two features indicated in the specification, the claims and/or the figures also fall within the scope of the invention. In the indicated ranges of values, values that lie within the above-mentioned limits are also to be considered disclosed as boundary values and can be claimed in any combination.

The basic idea of this invention is to design at least one of the two opposing electrodes, in particular the lower one in the plasma chamber and/or the two-part one used for picking up substrate or the one made of two electrode units.

In other words, the invention relates to a unit and a method for generating an optimum field homogeneity with a two-part electrode for plasma chambers. An in particular circular substrate receptacle is integrated into the lower electrode, whereby the lower electrode has an outer periphery (outer electrode unit) and an inner area (inner electrode unit). The inner electrode is preferably movable relative to the outer electrode and is used at the same time to hold substrates in the plasma chamber.

According to a preferred embodiment of the indicated invention:
1) The inner electrode of the sample pick-up and removal (wafer-holding device) is used,
2) Loading and unloading are without loading pins, and
3) After the loading, the inner electrode unit runs into a corresponding recess of the outer electrode unit, whereby in particular a closed, flat and/or contact-providing surface, in particular with a uniform potential, is produced.

The movable inner electrode unit replaces in particular the loading pins for loading and unloading the substrates, so that the latter can be eliminated according to the invention. This design makes possible a more homogeneous plasma in comparison to structures with loading pins as a sample pickup device. Because of the loading pins, an inhomogeneity of the plasma field results, which leads to voltage peaks during the process at the corresponding recesses.

Because of a full-surface contact surface of the inner and outer electrode unit that can be produced according to the invention with a lateral surface of the substrate, these field shifts do not occur, and a more homogeneous plasma is produced.

In addition, the time-consuming adjustment of the loading pins is eliminated, which in the outer electrode unit is replaced by the mechanical construction of the inner electrode unit and leads to a smaller amount of time spent in comparison to the conventional designs.

Another advantage comes from the large-area seating in the handling of thin substrates, which cannot be handled with the loading pin design because of their bending. The size of the inner electrode unit is adaptable and thus suitable for different types of substrates.

This invention accordingly relates in particular to a two-part electrode for plasma chambers with optimal electrical field homogeneity. In a first embodiment according to the invention, the plasma chamber has an RF electrode (second, in particular upper, electrode) and a counter-electrode (first, in particular two-part, electrode) with a substrate holder for picking up a substrate. In particular, a high-frequency alternating field for producing plasma is generated between the RF electrode and the counter-electrode. In a second, preferred embodiment, the plasma chamber has in particular an RF electrode (second, in particular upper, electrode) and an RF counter-electrode (first, in particular two-part, electrode) with a substrate holder for picking up a substrate. The housing is the counter-pole in this embodiment. Preferably, the housing is grounded.

A substrate, preferably a wafer, is positioned between the first and the second electrodes. The first and second electrodes are arranged on opposite sides of the plasma chamber and are preferably referred to as lower and upper electrodes. In the embodiment according to the invention, one of the two electrodes, preferably the tower electrode, comprised of two assemblies, in particular an inner electrode unit and an outer electrode unit.

The inner electrode unit is used in the substrate pickup and substrate removal for the substrates that are to be treated (wafers, thin-layer substrates, etc.).

The substrate holder (first electrode) is constructed in particular in such a way that in the loading of the first electrode with the substrate, the inner electrode unit (designed in particular as a sample holder) is run upward, and a robotic arm can put into position the substrate on the inner electrode unit. The robotic arm (paddle) has in particular a corresponding recess for picking up the substrate.

The inner electrode unit is moved in particular in a Z-direction, preferably between 0 and 50 mm upward, more preferably between 2 and 25 mm, and most preferably between 2 and 10 mm upward. The zero point in the Z-direction is the plasma application point, where the support surfaces of the inner and outer electrode units are aligned at the same height, i.e., form a support plane E that is in particular completely closed and that preferably has a constant potential.

The substrate holder is preferably built so that after the loading, the inner electrode runs into the part of the outer electrode, whereby a closed, flat, and/or contact-providing surface, in particular with a uniform potential, is formed.

The electrode unit is preferably designed as a sample holder/substrate holder. The substrate holder and/or the sample holder can have attaching elements for attaching the substrates. The attaching elements can be mechanical clamps and/or adhesive, in particular switchable, surfaces and/or vacuum strips, and/or electrodes as part of an electrostatic device and/or magnetic devices, in particular permanent magnets or electromagnets. If substrate holders and sample holders have attaching elements, the attaching elements can be switched independently of one another. As a result, it is made possible according to the invention to detach a substrate from the substrate holder, while the centrically-mounted inner sample holder can move and in this case maintains the attachment of the substrate at the same time.

During the unloading process, the inner electrode unit is accordingly raised so that after the plasma treatment, the substrate can be removed with the automatic robotic gripper.

As a substrate, in particular a product substrate, preferably a semiconductor wafer, is used according to the invention. The substrates can have any shape but are preferably circular. The diameters of the semiconductor substrates preferably correspond to the diameters of 2 inches, 4 inches, 6 inches, 8 inches, 12 inches or 18 inches that are standard in the semiconductor industry, but they can also deviate from the latter if necessary. Substrates preferably comprise materials and/or alloys such as, e.g., silicon (Si), silicon oxide ($SiO_2$), silicon nitride ($Si_3N_4$), aluminum (Al), wolfram (W) and titanium (Ti). In principle, the embodiment according to the invention can handle any substrate, in particular independently of its diameter.

An independent aspect according to the invention includes in particular using the inner electrode unit at the same time as a substrate receptacle and is movable, and thus a simple loading and unloading of the sample without loading pins is made possible. The substrate receptacle is used to pick up a large-area substrate or substrate stack, or a number of electronic component groups, in particular wafers.

Another independent aspect according to the invention inincludes arranging or aligning the support surfaces of the inner and outer electrodes at the same height and thus in forming a homogeneous first electrode at the plasma application point. The substrate lies in particular Over the entire surface on the inner and the outer electrode units and is held by the action of gravity and by a focus ring on the first, in particular lower, electrode. Another or an additional possibility of attaching substrates to the sample holder is done using vacuum or underpressure. Because of a Bill-surface contact surface of the inner and outer electrodes, field shifts do not occur, and a more homogeneous plasma is produced.

The second electrode that is designed in particular as a plasma electrode has in particular a carrier part or an outside part made of materials such as ceramic, glass, silicon, or a mineral-ceramic composite material, as well as an electrode head made of a conductive material.

The first, in particular two-part, electrode preferably includes materials and/or alloys comprised of wolfram (W), copper (Cu), aluminum (Al), platinum (Pt), chromium (Cr), nickel (Ni), gold (Au), titanium (Ti), and/or high-grade steel.

Other components of the device preferably are comprised of graphite or silicon carbide. If necessary, different carrier materials and/or electrode materials are used, since the electrical property of the materials used can exert an influence on the discharge. In the case of a coating of the electrodes, depending upon the electrode material, the layer thickness can exert an influence on the discharge. The layer thickness is preferably between 0.1 and 300 μm, more preferably between 0.1 and 200 μm, and most preferably between 0.1 and 100 μm. Depending on the application, independently of the type of metal used, the electrode can also be coated with a dielectric protective layer made of, e.g., aluminum oxide ($Al_2O_3$) ceramic.

Generators for operating and/or triggering electrodes for LIT (low frequency), RF (radio frequency) and MW (microwave) are preferably used with the following frequencies: LF generator with frequencies of between 20 and 800 kHz, preferably with frequencies of between 40 kHz and 400 kHz, and capacities of between 1 and 100,000 watts, preferably between 20 and 2,500 watts; RF generator with frequencies of between 3 and 300 MHz, preferably with frequencies of between 3 and 30 MHz, and capacities of between 1 and 100,000 watts, preferably between 20 and 1,000 watts; MW generator with frequencies of between 300 MHz and 300 GHz, preferably between 300 MHz and 3 GHz, and capacities of between 10 and 1,200 watts or higher. Frequencies of 40 kHz are only conditionally suitable for semiconductor front-end processes but well-suited for back-end processes. Frequencies of 13.56 MHz are suitable for front-end processes and for back-end processes. In the case of low frequencies of 40 kHz, the plasma density is comparatively low and thus also the proportion of radicals produced is lower, which leads to a lower removal rate (e.g., during dry etching). If necessary, both frequency ranges can be used for both electrodes. Each electrode is preferably connected to a separate power supply in the form of a generator for the first electrode and an in particular separately controllable, in this connection, second generator for the second electrode. By the selection of external electrical parameters such as voltage, current and frequency, the plasma discharge can be controlled depending on need and application. Thus, it is possible, by individually-matched operating conditions, to increase the selectivity of plasma-chemical processes.

The dielectric focus ring preferably comprises the same material as the substrate, Preferred dielectric materials are silicon dioxide ($SiO_2$), silicon nitride ($Si_3N_4$), aluminum oxide ($Al_2O_3$), silicon carbide (SIC) and silicon carbonitride (SiCN). The focus ring is applied in particular on the top of the outer electrodes, i.e., on the support plane. Selection of material and positioning on the first electrode are to be selected according to the invention in such a way that potential differences that are as small as possible or no potential differences occur between the focus ring and the substrate. In this connection, the homogeneity at the edge of the substrate is influenced in a positive manner.

The embodiment according to the invention is preferably found in a hermetically-sealable chamber that is accessible, in particular evacuatable, by raising a cover, most preferably in a plasma chamber. In addition to high-grade steel chambers, quartz glass chambers can be used.

The plasma chamber is evacuated for plasma bombardment in particular at a pressure of less than 1 bar, preferably less than 1 mbar, more preferably less than 0.1 mbar, most preferably at less than 0.01 mbar, and with utmost preference less than 0.0001 mbar. The plasma chamber can also preferably be subjected to overpressure. In this case, the maximum pressure is in particular greater than 1 bar, preferably greater than 1.5 bar, more preferably greater than 2 bar, most preferably greater than 5 bar, and with utmost preference greater than 10 bar.

An ion stream measuring sensor can be integrated into the plasma chamber for process control. The two-part electrode can be used for different types of operation of the plasma chamber, such as, e.g., PE (plasma-etching) operation or RIE (reactive-ion-etching) operation. In semiconductor technology, an RIE operation is used to produce structures in waters since the directed plasma strikes the substrate in a perpendicular manner.

Depending on the plasma gas that is used and the energy that is supplied, temperatures of 400 to 50,000 K are reached in the plasma jet. Based on the processes in the plasma chamber, a considerable increase in temperature can occur, which leads to a heating of the substrate. The cooling or heating of the substrate is done via a thermal coupling to the substrate receptacle, which has in particular cooling and/or heating elements. In order to ensure a uniform thermal coupling between substrate and substrate receptacle, an adequate thermal contact of the substrate with the substrate receptacle (first electrode) according to the invention that is over the entire surface can be produced during the plasma treatment. A coolant, e.g., liquid helium, can be circulated on the bottom of the wafer in order to cool the wafer. Instead of a cooling line, other cooling elements can also be provided, such as, e.g., a Peltier element. The substrate can be heated in particular by a heating system, which is arranged in an integrated manner in particular in the first, two-part electrode.

In the case of temperature-dependent reactions, the plasma is used in particular for the etching of a substrate. In this connection, it is important to maintain a homogeneous, constant temperature on the surface, to be etched, of the substrate, since the etching reaction is temperature-dependent. Advantageously, temperature probes or thermocouples or temperature sensors are integrated into the substrate holding device. In another embodiment, the substrate holding device or the two-part electrode contains gas inlet lines or openings or outlet lines or openings.

Additional advantages, features and details of the invention follow from the subsequent description of preferred embodiments as well as based on the drawings.

BRIEF DESCRIPTION OF THE DRAWINGS

FIG. 1b a cross-sectional view of the embodiment according to FIG. 1a,

In the figures, identical components and components with the identical function are identified with identical reference numbers.

DETAILED DESCRIPTION OF THE INVENTION

Figure 1A:
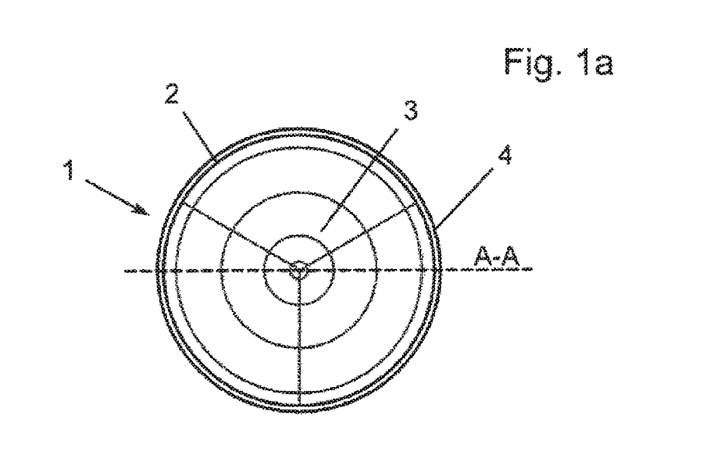
FIG. 1a an overview of an embodiment of the device according to the invention.

FIG. 1a shows a top view of an in particular lower, first electrode 1 in a plasma chamber 6, in particular with an integrated substrate holding device according to an embodiment of the invention. The holding of a substrate 7 is done in particular by vacuum strips and/or by a focus ring 4, 4'. The first electrode 1 has an outer electrode unit 2 that is designed as a ring electrode and an inner electrode unit 3. The inner electrode unit 3 is laterally limited and enclosed by the outer electrode unit 2. The substrate 7 is held on the outside by the focus ring 4, 4' that surrounds, in particular encloses, the substrate 7.

Figure 1B:
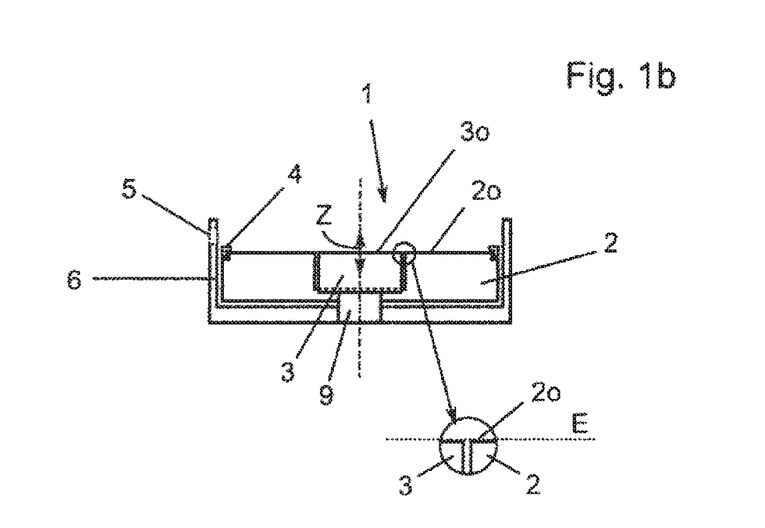

FIG. 1b shows a cross-section through the first electrode 1 and the plasma chamber 6. The first electrode 1 that is formed in two parts or from the inner electrode unit 3 and the outer electrode unit 2 is used as a holding device for the substrate 7, in particular with a flat surface 2o of the outer electrode unit 2. The inner electrode unit 3 is used to load and unload the substrate 7, in particular with a flat surface 3o that preferably has vacuum strips.

In a plasma application position according to FIG. 1b, the surfaces 2o, 3o form a common, in particular contact-providing and/or closed, support plane E.

Figure 1C:
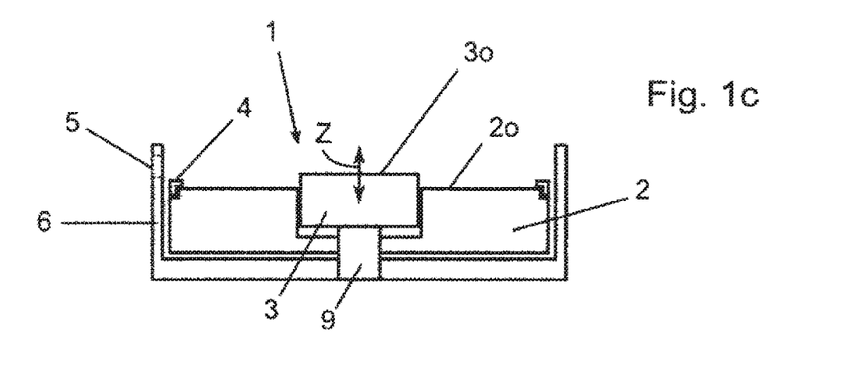
FIG. 1c a cross-sectional view of the embodiment according to FIG. 1a in a first process step according to the invention, FIG. 1d a cross-sectional view of the embodiment according to FIG. 1a in a second process step according to the invention, FIG. 1e a cross-sectional view of the embodiment according to FIG. 1a in a third process step according to the invention, FIG. 2a an overview of the embodiment according to FIG. 1a with a robotic gripper, FIG. 2b an overview of the embodiment according to FIG. 1a with an alternative robotic gripper, FIG. 2c an overview of another embodiment of the device according to the invention, and FIG. 3 a detailed cross-sectional view of another embodiment of the device according to the invention.
Figure 1D:
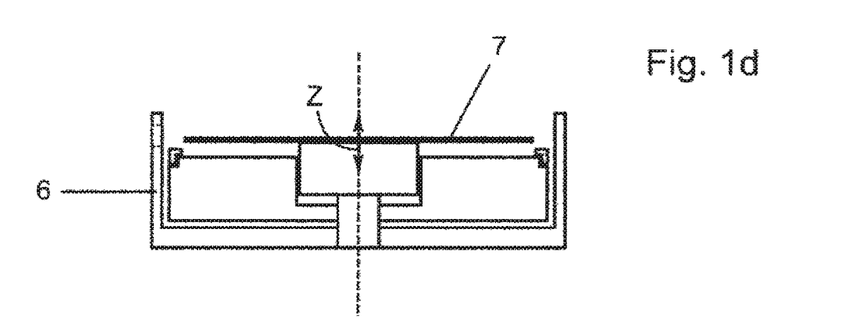

FIGS. 1b to 1e show an embodiment according to the invention of a process sequence according to the invention. FIG. 1c shows that the inner electrode unit 3 compared to the outer electrode unit 2 is raised in a Z-direction (lifting mechanism 9, see also FIG. 3) or pulls out from the support plane E (loading position). The substrate holding device comprises a lifting mechanism, which is connected to the inner electrode unit 3. A radially-mounted drive shaft of the lifting mechanism 9 lifts the inner electrode unit 3, designed in particular as a sample holder, in the Z-direction perpendicular to the electrode surface 3o. The lifting mechanism can be operated by means of a control network (not shown).

Figure 2A:
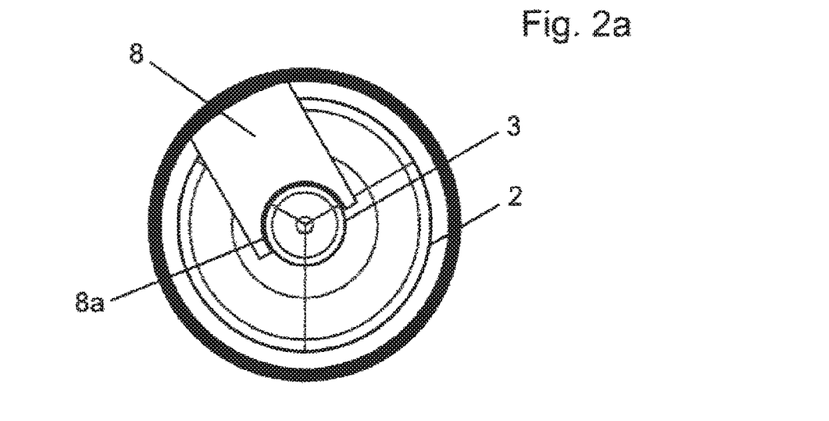
Figure 2B:
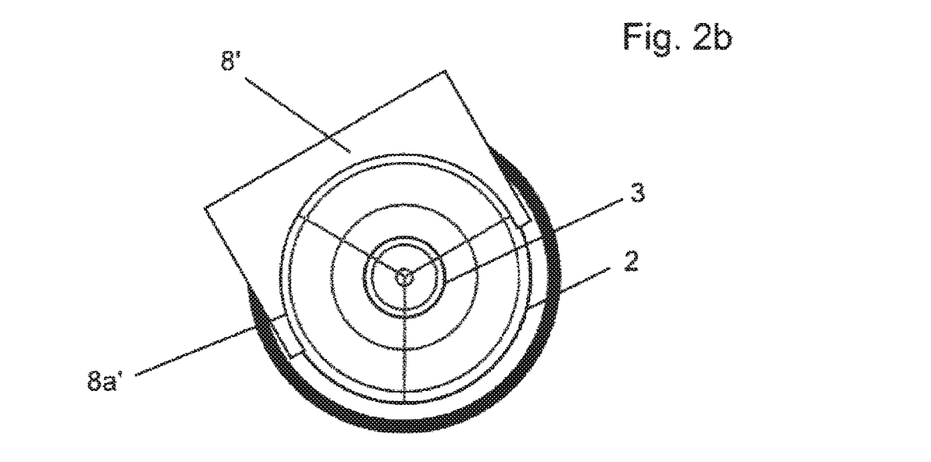
Figure 2C:
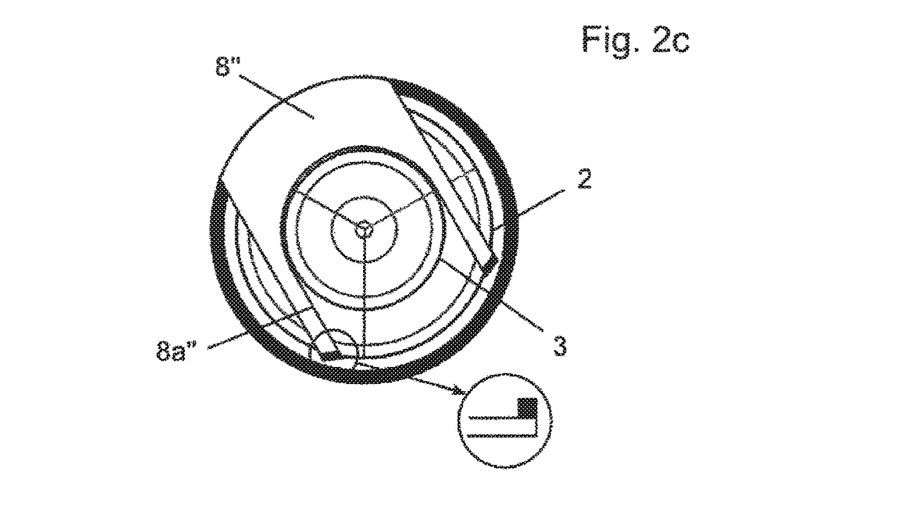

The substrate 7 is put into position by a handler or robotic gripper, in particular a robotic arm 8 (FIG. 2a), 8' (FIG. 2b), 8'' (FIG. 2c) on the inner electrode unit 3, designed in particular as a sample holder, and removed again after the plasma treatment. The robotic gripper(s) is/are stationary or mobile and perform(s) preprogrammed defined tasks. FIGS. 2a, 2b and 2c show three embodiments of the robotic arm 8, 8',8'' according to the invention. The robotic arm 8, 8',8'' runs through a correspondingly formed opening 5 (see FIG. 1b) of the plasma chamber 6 for loading or unloading the substrate 7. The robotic arm 8, 8',8'' has a recess 8a, 8a', 8a'' for picking up substrate 7 corresponding to the substrate size, as shown in the embodiments in FIGS. 2a, 2b and 2c according to the invention. In the embodiment of the robotic arm 8'' according to FIG. 2c, the outside contour of the substrate 7 is surrounded by clamping elements. By means of the robotic arm 8, 8',8'', the substrate 7 is put into position on the inner electrode unit 3 (see FIG. 1d). The substrate 7 lies, in particular over the entire surface, on the inner and outer electrode units 2, 3 (FIG. 2b) or only on the inner electrode unit 3, which can be matched to the size of the substrate (FIGS. 2a and 2c).

Figure 1E:
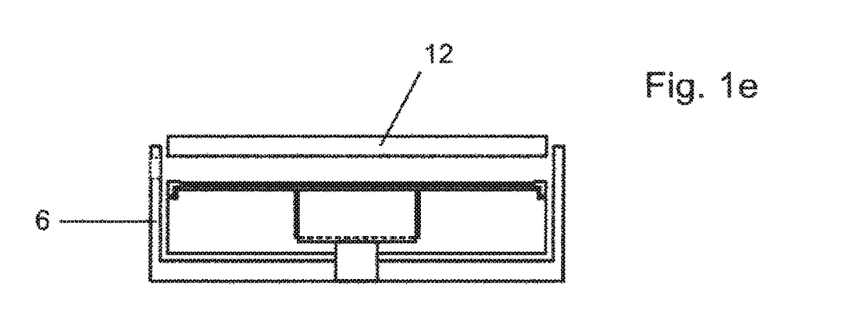

In the process step shown in FIG. 1e, the inner electrode unit 3 runs back into the plasma application position after the loading of the substrate 7, The substrate 7 is held by means of the focus ring 4, 4' and the action of gravity. As a result, all types of substrates 7, in particular those comprised of low-impedance materials (silicon) or high-impedance materials, can be held.

Figure 3:
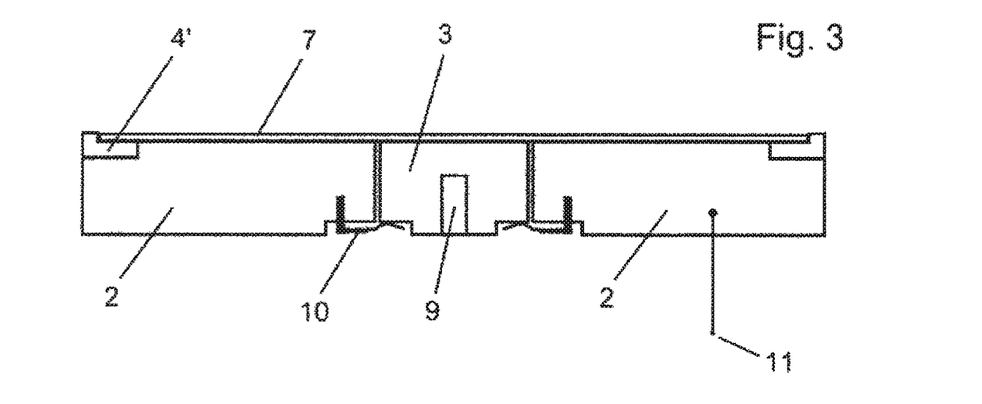

FIG. 1b and FIG. 3 show two different embodiments of the focus ring 4, 4' according to the invention.

Since the inner electrode unit 3 and the outer electrode unit 2 are brought in particular to the same potential for plasma treatment, insulation between inner and outer electrodes is not necessary. A homogeneous potential distributed over the substrate surface to be processed is achieved by a uniform potential and the elimination of disruptive factors (such as, e.g., loading pins). The two-part first electrode 1 thus does not show any electrical field peaks. The homogeneous potential distribution leads to a homogeneous plasma along the entire substrate 7.

As shown in FIG. 1e, a second electrode 12 is arranged opposite to the first electrode 1 in order to form plasma between the electrodes 1, 12. To this end, the plasma chamber 6 is closed in order to be able to set the conditions necessary for the plasma.

In a preferred embodiment, a high-frequency voltage, in particular capacitive, is coupled via a high-frequency connection 11 to the first electrode 1, in particular to the outer electrode unit 2. In this case, the capacitor is preferably integrated in an adaptive unit. Thus, an ohmic coupling is created, whereby the electrical line to the generator (high-frequency connection 11) is connected to the electrode via a coupling capacitor. The coupling capacitor, which is switched between electrode and generator, is used in particular as a high-pass filter in order to filter out the corresponding d.c. components, so that the a.c. voltage component is applied preferably exclusively to the electrode. In particular, the high-pass-filtered voltage component can be superimposed with a pure d.c. voltage component.

FIG. 3 shows a detailed cross-section of an embodiment of the two-part electrode 1. The electrical coupling via the high-frequency connection (RI connection) 11 and electrical contacting elements 10 for bringing the inner electrode unit 3 into contact are shown here. After the substrate is loaded onto the inner electrode unit 3, spring contact elements 10 are brought into contact when the inner electrode unit 3 enters the outer electrode unit 2 when reaching the plasma application position.

The substrate 7 is held by the action of gravity and by the focus ring 4, 4'. Corresponding contact points of the inner electrode unit 3 and the outer electrode unit 2 are connected by means of the spring contact element 10, so that the outer and inner electrode units 2, 3 are brought to the same potential.

The two-part electrode 1 has in particular at least two spring contact elements 10, preferably more than two, more preferably more than three, still more preferably more than four, and most preferably six or more spring contact elements 10. In a preferred embodiment, exactly six spring contact elements 10 are used.

In an alternative embodiment according to the invention, the contact points of the inner and outer electrode units 2, 3 are electrically connected by means of wire connections. After the substrate 7 is loaded onto the inner electrode unit 3, the open contact points are brought into contact when the inner electrode unit is entered. This leads to very good conductivity between the electrode units 2, 3. Preferably, metal strip conductors or wire connections are arranged between the inner and outer electrode units 2, 3, Each electrode unit 2, 3 preferably has several contact areas, in particular distributed on the periphery. The inner and outer electrode units are in each case electrically connected to the contact areas.

The two-part first electrode 1 has in particular at least two contact areas, preferably more than two, more preferably more than three, even more preferably more than four, and with utmost preference six or more contact areas.

In order to achieve effective coupling of the high-frequency connection 11 to the plasma chamber, the adaptive unit is preferably set so that the impedance of the plasma chamber is identical to the impedance of an RF coaxial line in the high-frequency connection 11. Coupled connections (e.g., d.c. voltage connections) and capacitor-switches (i.e., capacitive coupling networks) are integrated into the adaptive unit and are thus in particular not components of the two-part first electrode 1.

LIST OF REFERENCE SYMBOLS

1 First electrode
2 Outer electrode unit
2*o* Surface of the outer electrode unit
3 Inner electrode unit
3*o* Surface of the inner electrode unit
4, 4' Focus ring
5 Opening
6 Plasma chamber
7 Substrate
8, 8',8" Robotic arm
8*a*, 7 Recesses
9 Lifting mechanism
10 Spring contact element
11 High-frequency connection
12 Second electrode
E Support plane
Z-direction Having described the invention, the following is claimed:

1. A method for bombarding a substrate with a plasma in a chamber, said method comprising:
   providing a first electrode and a second electrode arranged opposite to the first electrode to produce the plasma therebetween, wherein at least one of the first and second electrodes comprises an inner electrode unit having a first support surface and an outer electrode unit having a second support surface;
   moving at least one of the inner and outer electrode units in a Z-direction such that the first support surface is located above the second support surface;
   loading a substrate on the first support surface using a robot arm when the first support surface is located above the second support surface;
   moving at least one of the inner and outer electrode units in the Z-direction such that the first support surface and the second support surface form a common support plane (E) for supporting the substrate during a plasma treatment of the substrate;
   supplying a plasma gas to the chamber; and
   applying a voltage to the first and second electrodes when the first support surface and the second support surface form the common support plane (E), wherein the first and second substrate support surfaces have the same potential during the plasma treatment of the substrate, thereby distributing the plasma homogenously over the entire surface of the substrate.

2. The method according to claim 1, wherein the common support plane (E) is a closed surface with a uniform potential.

3. The method according to claim 1, wherein the inner electrode unit is moved in the Z-direction relative to the outer electrode unit.

4. The method according to claim 1, wherein the substrate is supported by both the first and second support surfaces during the plasma treatment of the substrate.

* * * * *